United States Patent [19]
Andreaggi

[11] 4,113,342
[45] Sep. 12, 1978

[54] CONDUCTOR ARRANGEMENT AND ASSEMBLY METHOD

[75] Inventor: Joseph R. Andreaggi, Short Hills, N.J.

[73] Assignee: Sangamo Weston, Inc., Newark, N.J.

[21] Appl. No.: 840,854

[22] Filed: Oct. 11, 1977

Related U.S. Application Data

[63] Continuation of Ser. No. 675,931, Apr. 12, 1976, abandoned.

[51] Int. Cl.² .............................................. H01R 13/06
[52] U.S. Cl. ......................... 339/176 MP; 339/17 C; 339/252 R; 339/276 SF
[58] Field of Search ............ 339/17, 75 MP, 176 MP, 339/252, 275, 276; 29/629, 626, 630 A, 630 B, 630 C

[56] References Cited

U.S. PATENT DOCUMENTS

| | | | |
|---|---|---|---|
| 3,701,071 | 10/1972 | Landman | 339/17 M |
| 3,744,009 | 7/1973 | Teagno et al. | 339/17 C |
| 3,808,589 | 4/1974 | Bonhomme | 339/17 L |
| 3,864,014 | 2/1975 | Lynch | 339/275 R |
| 3,902,776 | 9/1975 | Williams | 339/276 SF |
| 3,915,546 | 10/1975 | Cobaugh et al. | 339/275 B |
| 3,922,051 | 11/1975 | Reynolds | 339/17 L |

Primary Examiner—Joseph H. McGlynn
Attorney, Agent, or Firm—William R. Sherman; Edward Manzo; Walter Kruger

[57] ABSTRACT

An uninsulated contact array of resilient electrically conducting metal with bridging strips at each end to hold multiple conductors in predetermined spaced relation to each other. The bridging strips permit terminal tips at one end of the conductors to be stabbed into a circuit board simultaneously, for subsequent soldering. The other ends of the conductors, having contact ends, are maintained in spaced apart relation by a second bridging strip, the conductors and contacts permitting threading the contact ends simultaneously into multiple recesses of a display holder socket. The display holder socket is so arranged, that curving the resilient conductors increases the contact pressure of the contacts by bowing them. Resilient mounting arms of the contact holder provide for shock proof mounting of the contact holder in a casing by clamping the resilient arms between the casing and cover of an instrument housing.

18 Claims, 13 Drawing Figures

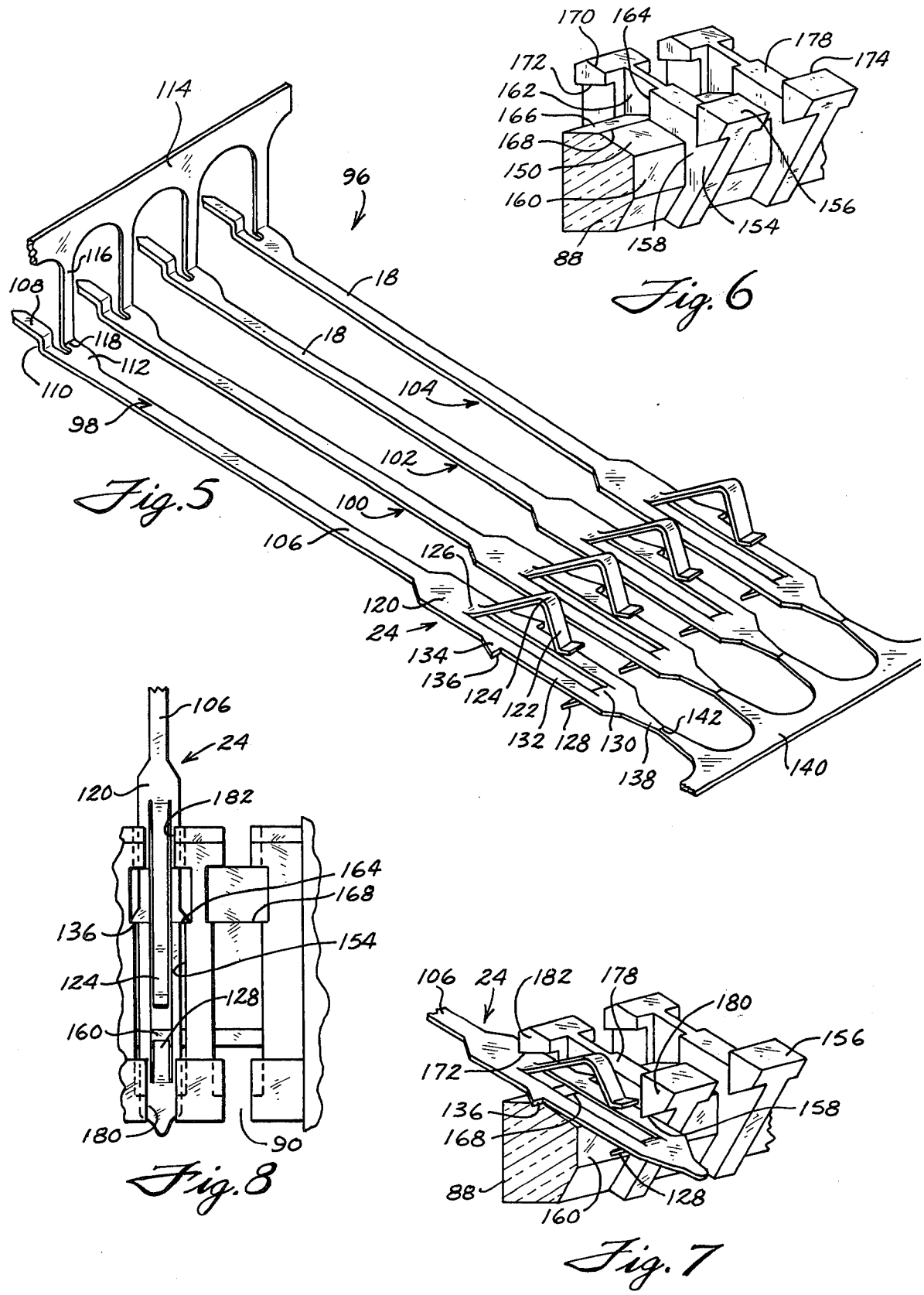

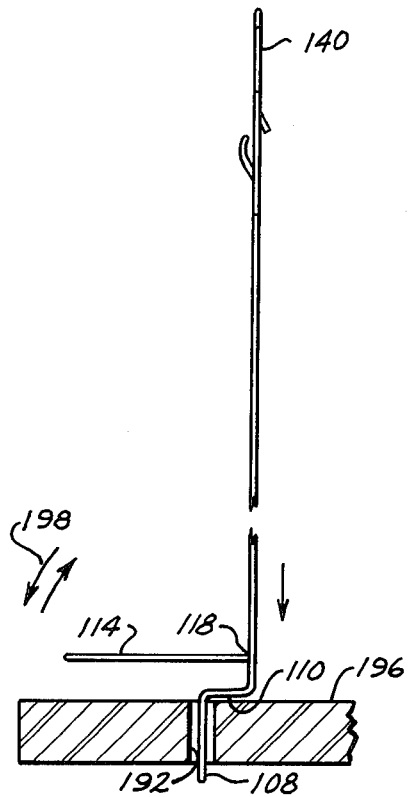
Fig. 10
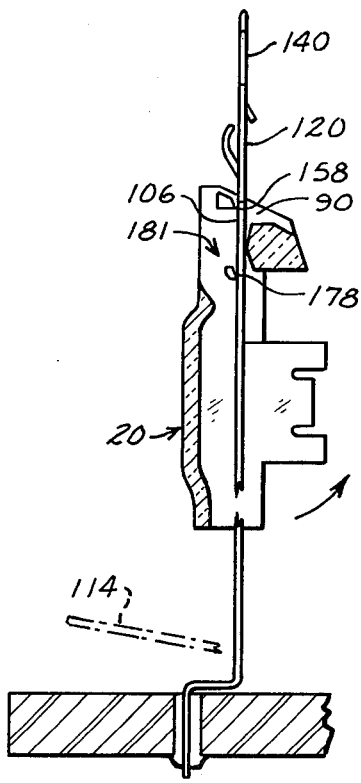
Fig. 11
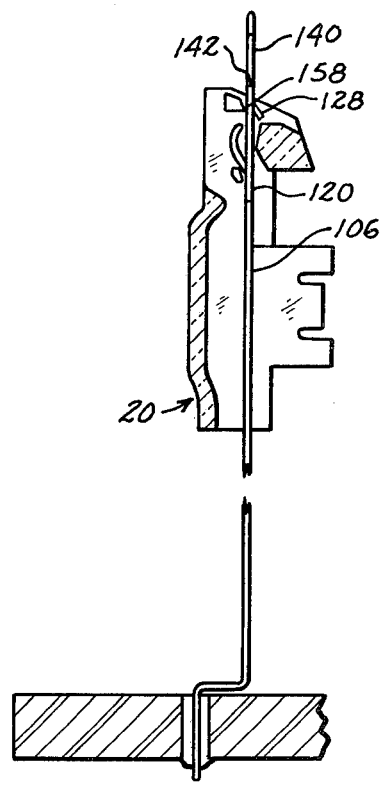
Fig. 12
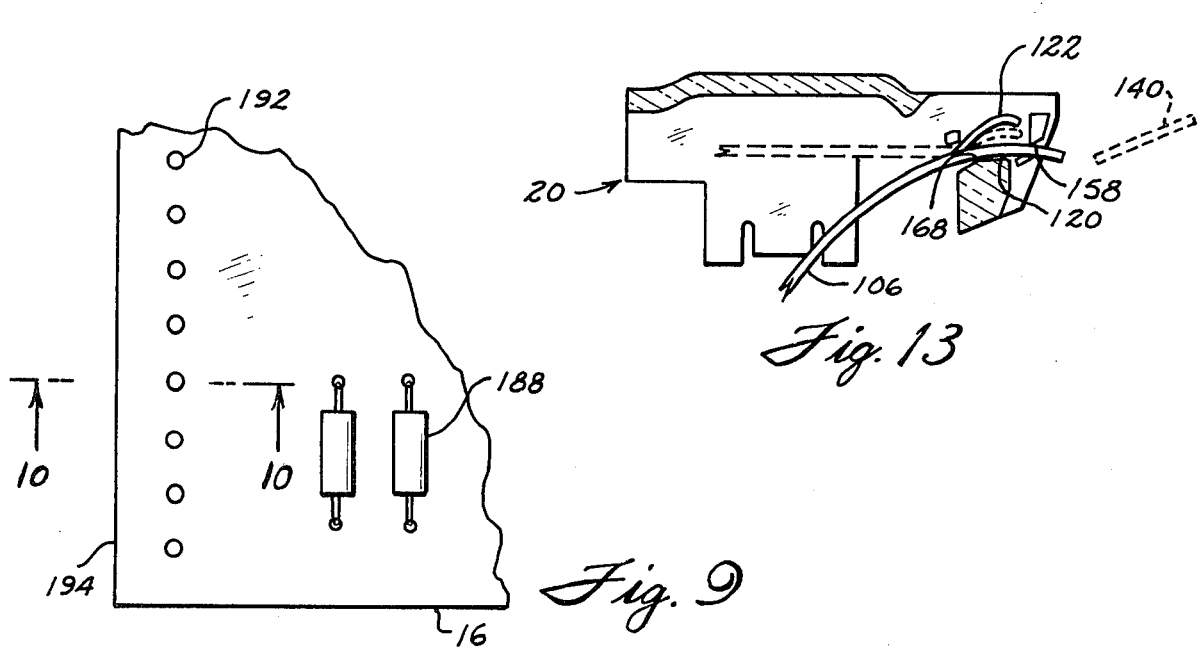
Fig. 13
Fig. 9

CONDUCTOR ARRANGEMENT AND ASSEMBLY METHOD

This is a continuation of application Ser. No. 675,931, filed Apr. 12, 1976, now abandoned.

This invention relates to an electronic apparatus including an electrical conductor arrangement for making multiple electrical connections between spaced apart terminal points or conductors, and to a method of assembling such electronic apparatus.

The uninsulated conductor arrangement of this invention has particular utility for connecting conductors of a terminal or circuit board to the conductors of another board or panel, spaced from the first board. In a preferred embodiment, one of the boards is a plug in type digital display panel, and resilient contacts at common ends of the conductors are mounted in a combined holder-socket which houses the panel board.

Although many electronic circuits have been miniaturized to micro-size, a continuing problem in microelectronics is making the connections between the microelectronic components and other components which cannot be miniaturized, such as displays and power supplies.

Correspondingly, while it has been possible to produce circuit boards with components mounted thereon by generally mass production techniques, a problem exists in making the electrical connections between circuit boards as well as between a circuit board and a readout device such as a digital display panel.

Seven segment display digits are widely used in digital displays of electronic devices such as hand held calculators and digital readout electronic test equipment, for example, volt meters and multimeters. Such displays usually require seven conductor connections for each digit, and additional conductors and connections are required for a floating decimal point and common return path, such as ground. Correspondingly, a three digit readout with floating decimal point will require on the order of 26 electrical connections to the register or driver circuitry.

In accordance with this invention, a conductor array and contact arrangement is provided which vastly simplifies making electrical connections between, for example, a circuit board and a display panel spaced from the circuit board and which can be of the plug in type. A specific application for this conductor-contact array is for connecting a register or display driver circuit board to a digital readout panel such as a liquid crystal display panel.

In accordance with the invention, the panel, which can be a display panel or a plug in circuit board, has a plurality of parallel spaced apart conductor areas and is adapted to plug into a unique contact holder or socket which supports resilient contacts that engage and electrically connect to the panel conductors. The resilient contacts are integral, respectively, with elongated conductors having terminal tips at ends remote from the contacts and adapted to be secured to aligned electrical terminals of a circuit board, the terminals preferably having the same spacing as the contacts at the other ends of the conductors. Each conductor and contact element is formed from metal with resilient or spring like characteristics. The conductor portions are each flat, with the width of each conductor substantially greater than its thickness so the conductor portions are flexible or resilient in one direction, but are laterally stiff. The conductors are in side by side relation and can be equally spaced, the preferred spacing being on the order of about twice the width of a conductor portion. By virtue of such lateral rigidity and flexibility in a direction normal to the direction of lateral rigidity, the conductors can be curved in unison within their elastic limits, like a leaf spring, while connecting circuit board and other electrical components.

In the preferred embodiment, each conductor element has a terminal tip at one end and a spring contact at the other end. The plug type socket has recesses to receive the contact ends of the conductors, and the circuit board has aligned openings to receive the terminal tip ends of the conductors. The conductors are formed in a multiple conductor array with two integral bridging strips, one to maintain the contact ends in predetermined speed relation, and the other to maintain the terminal tips in predetermined spaced relation. The bridging strip near the terminal tip ends of the conductors is so formed that all the terminal tips can be associated simultaneously with conductors of the circuit board and soldered or otherwise secured prior to disconnecting this bridging strip. The bridging strip at the contact ends of the conductor elements provides for threading all the contacts through recesses in the plug board socket simultaneously, in a single operation. The socket, by virtue of its unique construction, permits simultaneously introducing the contact elements into all the socket recesses, and the contact ends and recesses each have cooperating surfaces and fingers to snap-lock the contact ends in the recesses when the contact ends are seated. After the contact ends are locked in their sockets, the bridging strip at the contact end is broken away. The contact ends are retained in spaced apart relation to each other by the insulating material socket.

Correspondingly, in accordance with the invention, the conductors are handled as an assembly, with the bridging strips which are located closely adjacent the ends of the assembly maintaining the terminal tips and the contact ends relatively rigid and precisely spaced to facilitate handling and assembly. By virtue of such bridging strips adjacent each end of the conductors, the conductors can be quite thin, yet can be of substantial length, without presenting handling problems.

The terminals in the circuit board are preferably apertures formed in conductors on the board. To further simplify associating the terminal tips with the contacts, it is preferred that each terminal tip have an offset shoulder to stop on the component side of the circuit board, to limit the depth of insertion of the tip into a circuit board aperture, the tip having a length to project through the board for soldering. With the tips held rigidly in spaced apart relation by the terminal tip bridging strip, and with the depth of insertion of each tip limited by the terminal tip shoulder, soldering is easily accomplished, and can be done by solder dipping at the same time that the other electrical components on the circuit board are soldered to the conductor foils. Since the bridging strip at the contact end of the conductors holds these opposite ends relatively rigidly, the board is relatively easy to handle even though the conductors are relatively thin. This permits connecting the contact ends to the socket at any time, preferably at final assembly of the apparatus.

The resiliency of the conductor bodies, and their length, permits mounting the circuit board and socket after the conductors are secured to both the board and the socket. By virtue of the resiliency of the conductors in a plane transverse to the conductor plane, the socket can be turned about an axis parallel to the circuit board and the conductor plane, to any desired position, and can then be secured. In the preferred arrangement, the curvature of the conductors, caused by turning the socket with respect to the circuit board, to orient the socket for mounting, is somewhat greater than 90°. Such curving of the conductors tensions and further rigidifies each conductor body so there is no danger of engagement between adjacent conductors even if the electrical assembly is dropped or bumped. Correspondingly, there is no need to electrically insulate the conductors.

Correspondingly, in accordance with another aspect of this invention, there is provided a conductor arrangement including multiple bare conductors extending between a circuit board or other electrical component having multiple terminals and a second component also having multiple terminals, where the conductors are resilient and can be curved elastically to tension them, to permit mounting the second component at a desired angle with respect to the first component, after the conductors are connected between the components, and without requiring insulation on the conductors.

In accordance with another aspect of this invention, the curvature of the conductors, within the elastic limit of the conductors, causes bowed contacts at the contact ends to project further toward the plug in panel to enhance the contact pressure of the contacts. After the conductors are assembled to both the circuit board and the socket, it is preferred that the display panel be plugged into the socket before the socket is oriented and mounted in its casing. When the bowed contacts are relaxed, the contact pressures are very low, and the panel can be plugged into the socket without danger of damaging the relatively thin deposited conductors of the display panel during sliding movement between the panel and the contacts. After the panel is seated in the socket, the socket is oriented to its mounting position, and during such orientation, the contacts are further tensioned to increase the contact pressure and insure excellent electrical connection between the contacts and the panel board conductors.

In accordance with another aspect of this invention, the socket takes the form of a display housing with a transparent window protecting the digital display panel, and with the contact retaining socket recesses integral with the window and at one end of the display housing. Guide tracks in the sides of the display housing retain the panel and assure its proper positioning with respect to the contacts.

In accordance with another aspect of the invention, the socket or display panel holder includes a pair of laterally extending mounting arms each with a fork shaped end presenting mounting fingers, offset with respect to each other, and which are elastic. Such arms form the sole mounting points for the display holder, and are adapted to be received and clamped between support surfaces located respectively in upper and lower portions of a casing which houses the display panel holder and circuit board. Such construction permits quite rapid final assembly of the instrument since no separate screws or fasteners are required to hold the display window in the casing. During final assembly, the display holder is merely oriented to its mounting position, and the casing cover of the instrument is positioned over the holder to both secure the holder to the instrument casing and to close the casing. So long as the cover is in position, the display holder is clamped between the cover and base, and its resilient fingers provide a resilient shock proof mounting. Advantageously, the cover has an abutment adjacent the display panel, which prevents movement of the panel with respect to the display holder-socket.

Correspondingly, in accordance with the method and construction of the invention, only a minimum number of parts and pieces is required for the display panel, display holder, conductors and contacts, and the mounting of the display holder in a shock proof manner between the base and cover of the instrument.

Numerous other objects, features and advantages of the invention will become apparent with reference to the accompanying drawings which form a part of this specification.

BRIEF DESCRIPTION OF THE DRAWINGS

FIG. 5 is a pictorial view of a contact array, according to the invention;

FIG. 6 is an enlarged pictorial view of the contact retaining portion of the display holder of FIG. 3;

FIG. 7 is a view corresponding to FIG. 6 and showing a contact end in position in a recess of the display holder;

FIG. 8 is a top plan view of the contact retaining portion of the display holder as shown at FIG. 7, with a contact end therein;

FIG. 9 is a plan view of a portion of the circuit board of the instrument of FIG. 1, showing its array of terminal openings;

FIG. 10 is an enlarged side view in section taken along line 10—10 of FIG. 9 and showing a conductor array positioned on the circuit board;

FIGS. 11 and 12 are side views in section and show the sequence of steps to connect the contact ends of the conductors to the display holder, with FIG. 11 showing the conductors threaded through the holder, and FIG. 12 showing the contact ends seated in the holder; and FIG. 13 is a side view in section showing the manner in which increased contact pressure is obtained by curving or tensioning the conductors.

DETAILED DESCRIPTION OF PREFERRED EMBODIMENTS AND METHOD

Figure 1:
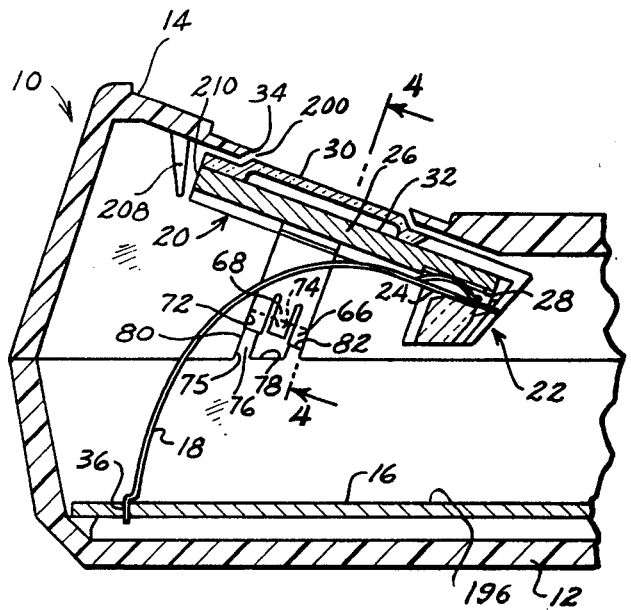
FIG. 1 is a partial side view in section showing a portion of an electronic instrument incorporating features of this invention.

FIG. 1 shows a portion of an electronic instrument 10 which can be a portable digital multimeter or digital voltmeter. Instrument 10 includes a base casing 12 and a cover 14 which seats on and closes the casing. A circuit board 16 is secured near the bottom of casing 12, and multiple conductors 18 extend from the circuit board to a display holder or housing 20 having a socket portion 22 in which contact ends 24 of the conductors are secured. A display panel 26 is plugged into the socket portion so conductors on surface 28 of the panel engage and electrically connect to the contact ends 24 of conductors 18. Display housing 20 has a transparent window 30 which is rectangular and through which the digits on the display face 32 of display panel 26 are visible. Top cover 14 is opaque, and has a rectangular opening 34 through which only the display face 32 of panel 26 can be seen, when the cover is in position as shown at FIG. 1.

Each conductor 18 has a terminal tip 36 which extends through an opening in circuit board 16 and which is soldered to the circuit board prior to mounting the circuit board in casing 12.

Figure 2:
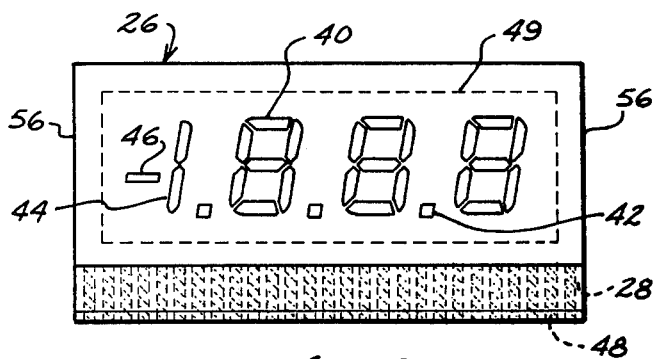
FIG. 2 is a plan view of a liquid crystal display panel used in the instrument of FIG. 1.

FIG. 2 shows display panel 26 in greater detail. Such display panel is preferably of the liquid crystal type, operating in the reflective mode, and can include three seven segment digits, such as digits 40, several decimal points, such as decimal point 42, a "1" digit 44 and a minus sign 46. The type of display, is of course exemplary and the display panel can have any desired number of digits.

The various segments, decimal points, etc. within the body of display panel 26 are electrically connected to conductors 48 exposed on the rear portion of the lower surface of the display panel (surface 28 of FIG. 1). Each of the conductors 48 is of the deposited type and is a fraction of a mil thick, so the conductors within the body 49 of the display, are transparent, and hence, not visible to one looking at the display through opening 34 of the casing. As is apparent from FIG. 2, display panel 26 has a total of 27 electrical conductors 48 exposed on its rear surface 28. The minutely thin conductors 48 are subject to damage if abraded or scuffed.

Figure 3:
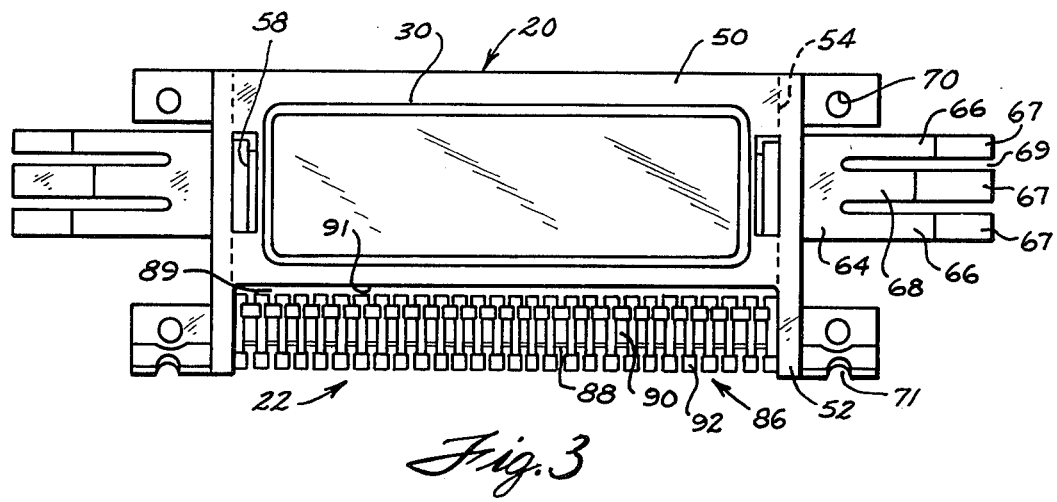
FIG. 3 is a plan view of a display panel holder with contacts and display panel removed for clarity of illustration.
Figure 4:
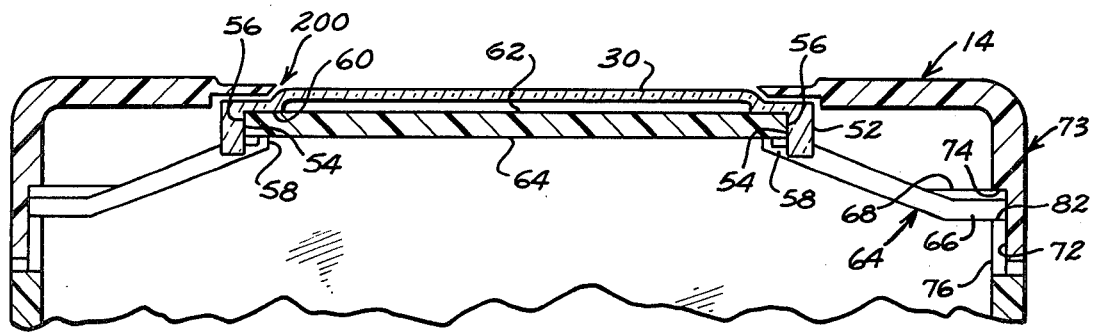
FIG. 4 is a partial view in section taken along line 4—4 of FIG. 1, and showing the cover before it is fully seated on the base.

As shown at FIGS. 3 and 4, display holder 20 takes the form of a one piece part, of plastic material, and is preferably molded from a transparent thermoplastic such as clear polycarbonate. Holder 20 has a generally rectangular frame portion 50 which surrounds rectangular window 30, the rectangular window projecting upwardly from this frame portion. Side walls 52 of the holder project rearwardly of frame portion 50 and have inside surfaces 54 spaced apart a distance only slightly greater than the width of display panel 26 as measured between its side edges 56. Correspondingly, the side edges 56 of the display panel 26 cooperate with surfaces 54 to locate panel 54 in the holder.

Projecting inwardly from each side wall is a display panel retaining lug 58 which is spaced from rear frame face 60 of the holder a distance approximating the thickness of the display panel, as measured between its front and rear surfaces 62, 64. Retaining lugs 58 prevent the display panel from moving in a direction perpendicular to the plane of window 30. The tracks formed by lugs 58, surfaces 54, and surface 60 serve to guide and accurately position the display panel in the holder 20.

Extending outwardly and downwardly from side walls 52 of the display holder are mounting arms 64 which are slightly narrower than window 30. As shown at FIG. 3, each mounting arm 64 includes a pair of outer fingers 66 separated from a central finger 68, by slots 68, which extend a major portion of the length of each arm. End portions 67 of each finger are parallel to the plane of window 30. As shown at FIG. 4, with the fingers relaxed, the outer fingers 66 are in a common plane, and central finger 68 is above the plane of the fingers 66 by a distance about one-half the thickness of the fingers. Each of the fingers 66 and 68 is thus relatively narrow and resilient. These fingers and arms provide a shock proof means for mounting the display holder in the casing. The display holder can also have openings 70 or recesses 71 to receive positioning pins (not shown) which can be provided in the cover 14 to align the display holder with the cover.

As shown at FIGS. 1 and 4, cover 14 has a generally inverted U-shaped recess 72, formed in the inside of each of its side walls 73, and which opens downwardly. Recess 72 presents a downwardly facing shoulder 74 generally parallel to the plane of display window 30, when the display holder is mounted in the casing. Side edges 75 of the recess are perpendicular to shoulder 74 and present a space to receive the fingers 66, 68 of the mounting arms 64. A projection of a width the same as recess 72 has a slot 78 and presents a pair of fingers 76, each of a width about the same as mounting fingers 66 of the display holder. End edges 82 of the fingers are parallel to shoulder 74. The cover and base are so dimensioned that the distance between shoulder 74, and the end edges 82 of fingers 76, when the cover is secured to the base, approximates the thickness of mounting fingers 66 of the display holder.

FIG. 4 shows fingers 66 and the cover and base in position immediately before pressing the cover home on the base. The final closing motion of the cover to seat on the base causes shoulder 74 to engage the top surface of central finger 68 to resiliently press this finger downwardly into the plane of the fingers 66. Such mounting of the display holder, with the fingers 66 and 68 tensioned, permits the display holder to move slightly with respect to the casing as a result of the resiliency of the fingers 66, 68, and thus provides a shock proof mounting and securing arrangement which is inexpensive, yet quite effective. Even if the space between shoulder 74 of recess 72 and end edges 82 of fingers 76 is greater than the thickness of fingers 66, 68, sufficient clamping action is attained by virtue of the offset resilient fingers 66 and 68, to firmly hold the display holder in position. The display holder 20 is solely supported by the arms 64.

The display holder, as shown at FIG. 3, does not yet have the contents mounted thereon. The contact ends 24 of the conductors 18 are received in the region of socket 22. A mounting block 86 which is an integral part of display holder 20 includes a continuous bar portion 88 which extends between and is integral at each end with side walls 52. As can be seen from FIG. 1, this bar portion is somewhat below the plane of window 30, and there is an open space 89 between bar portion 88 and lower edge 91 of frame 50, this space being continuously open between surfaces 54 of the side walls. The bar portion has multiple recesses 90 between locating ribs 92. The contact ends 24 seat and lock in the recesses 90 in a manner soon to be described. Recesses 90 are equal in number to the conductors 48 of the display panel, and a contact end 24 of a conductor is received in each recess. Where the display holder 20 is used with display panel 26, there are twenty-seven such recesses 90.

FIG. 5 shows a portion of a conductor-contact array 96, which includes multiple conductors 18. As shown, there are conductor-contact elements 98, 100, 102 and 104. Each conductor-contact element has a thin resilient conductor body portion 106 substantially wider than its thickness. This body portion is of uniform width and thickness along its length. At one end of each conductor body is a terminal tip 108 which preferably has a pointed end. The terminal tip is offset with respect to the plane of conductor body 106 by bending the tip to provide a shoulder 110 perpendicular to conductor portion 106. Slightly inwardly of shoulder 108 is an enlargement which provides a lateral extension 112, coplanar with body 106. The terminal tip ends of conductor-contact elements 98, 100, 102 and 104 are connected together by a bridging strip 114 with legs 116 projecting perpendicular to the conductors, and joining the lateral extensions 112 at a location spaced inwardly of shoulders 110. Legs 116 are joined to the lateral extensions 112 along a sharp crease or weakened line 118. As is apparent with reference to FIG. 5, the length of legs 116 is sufficient that the terminal tip ends, legs 116, and bridging strip 114 of the several conductors can be formed from a flat sheet of metal, by stamping, and the bridging strip 114 and legs 116 can then be bent upwardly to the position shown. The bridging strip 114, joined to conductors 18 at a location very close to the terminal tips 108, accurately spaces the tips, and holds them rigid.

Contact ends 24 of each conductor include an enlarged body 120 having a centrally disposed struck out contact portion 122 with a rounded contact nose 124. Contact 122 joins body 120 at a bend 126. Also cut from body 120 is a lock tab 128 which is bent downwardly in a direction away from contact 122. Lock tab 128 joins body 120 at bend 130. Between the bends 126 and 130, the body takes the form of relatively narrow parallel legs 132. A triangularly shaped latch finger 134 projects laterally outwardly from the outside of each leg 132. The latch fingers each present a latch surface 136 which faces toward lock tab 128, the surfaces being coplanar and located between bend 126 and lock tab 128. A nose 138 of each contact end is integrally joined with a bridging strip 140, which is coplanar with body 120 of the contact ends, and is joined to each nose 136 along a weakened or scored line 142.

The contact array 96 can be formed from a flat sheet of uniform thickness of electrically conductive material with resilient characteristics, such as phosphor bronze, by stamping and bending. Each of the multiple conductors 18 is somewhat resilient in all directions. However, by virtue of the width of each conductor body portion, such as conductor body 98, being substantially greater than its thickness, these conductor portions are relatively stiff laterally, in their common plane, but are quite resilient in a direction normal to this common plane. Legs 132 of contact body 120, while relatively stiff, exhibit some lateral resiliency. Latch fingers 134 are located on legs 132 along portions of the legw which exhibit such lateral resiliency. As will soon be described, latch fingers 134 and lock tabs 128 provide for snap locking contact ends 24 in the respective recesses 90 of the display holder. While conductor array 96 is illustrated with only four conductors 18, the array can, of course, have any number of conductors, for example, 27.

FIG. 6 pictorially shows a portion of the contact holder support bar 88 and illustrates the recesses 90 in greater detail. As shown at FIG. 6, a face 150 of support bar 88 forms the bottom of each recess 90. A rib 152 projects perpendicular to surface 150, and side faces 154 of this rib define the sides of the recess. Each rib has a laterally enlarged upwardly projecting forward end 156 which presents a sharp corner 158 diagonally opposed to the corner formed by surfaces 150 and 160 of bar 88. Each side wall 154 of rib 152 has a recess 162 which presents a lock surface 164. A rear surface 166 or bar 88 slopes with respect to surface 150 to provide an edge 168 in the plane of surfaces 164. The rear of each rib has a laterally enlarged end 170 which presents a retaining surface 172 that is spaced from and faces toward surface 166.

Each laterally enlarged forward end 156 has a surface 174, the surfaces of the several ends 156 being coplanar. Surfaces 174 act as a stop to limit the depth of insertion of display panel 26 into the holder. Surfaces 178 of the top of each rib from enlarged rearward end 170 to surface 174 are flat and coplanar and are parallel with surface 28 of display panel 26, when the panel is in the holder 20, as shown at FIG. 1.

FIGS. 7 and 8 show portions of the display holder support bar 88 with a contact end 24 in position in a recess 90. It can be seen from FIGS. 7 and 8, that the distance between side faces 180 of enlarged forward ends 156, as well as the distance between the side faces 182 of enlarged rearward ends 170 is slightly greater than the width of contact 124, and is greater than the width of conductor body 106. On the other hand, body 120 of the contact end is of a width approximating the distance between side faces 154 of the recesses 90, and the body is beneath retaining surfaces 172 of the enlarged rearward ends 170, and is also beneath edges 158 of the enlarged forward ends 156. Lock tab 128 engages lock surface 160 of bar 88 to prevent displacement of a contact end rearwardly, and latch surfaces 136 of latch fingers 134 engage surfaces 164 of recesses 162 to prevent pulling the contact ends in a forward direction from the display holder socket. Since surfaces 172 and edges 158 of the forward and rearward enlarged ends extend across the body 120 and legs 136 of the contact end, a contact end cannot be lifted from the recess 90 after it is positioned in a recess as shown at FIGS. 7 and 8. With the contact end disposed in a recess, it will be observed that edge 168 of bar 88 is generally aligned with latch edges 136 of the contact end, and the edge 168 is beneath the flexible or resilient legs 132. In addition, edge 158 extends over the body portion of a contact end near bend 130. With the conductor body 106 of each conductor-contact relaxed, the contact ends are relatively loose fits in the recesses, but are held against removal by the latch fingers and latch tabs. In this relaxed position of the conductor body 106, contact 122 has its contact point 124 only slightly above surface 178 of a rib so there is a very low contact pressure on the fragile conductors 48 of the display panel. It is in this relaxed condition of the conductor-contact elements that the display panel 26 is inserted into the holder 20. Then, when the conductor bodies are curved, as shown in FIG. 1, the contacts 122 are elevated and are further pressed against the conductors 48 of the display panel. When a conductor body 106 is bent downwardly, the front of a contact end is lifted into engagement with edge 158, and legs 132 tend to flex or bow upwardly as a result of engagement with edge 168. This causes contact 122 to move upwardly and correspondingly increases the contact pressure between nose 124 and a conductor 48 on the rear surface 28 of display panel 26. The bowed or higher pressure condition of the contacts is shown at FIG. 13.

This arrangement, permits inserting the display panel 26 into holder 20, when the contact pressure is very low, so damage to the conductors 48 is avoided as a result of the sliding movement of the contacts 122 on the conductors during such insertion. However, the contact pressure created when the conductor bodies are curved or tensioned, provides good electrical contact between the contacts 12 and the conductors 48 of the display panel.

METHOD OF ASSEMBLY

A preferred method of assembling electronic instrument 10 will now be described. As shown at FIG. 9, circuit board 16 has mounted thereon, electrical components such as resistors 188 having leads which extend through openings of the circuit board and through openings in printed or foil conductors (not shown) on the lower surface of the board. At one end of the board are a plurality of spaced apart terminal tip receiving apertures 192 which extend in a line parallel to edge 194 of the board. Apertures 192 are spaced apart the same distance as the spacing of terminal tips 108 of conductor array 96 (FIG. 5), by bridging strip 114.

Prior to soldering the leads of the components on the circuit board 16 to the circuit board conductors, a conductor array 96 is selected which has 27 conductors. The terminal tips 108 are aligned with and stabbed through openings 192 of the circuit board simultaneously, to the position shown at FIG. 10. At this stage of assembly, bridging strips 114 and 140 remain connected to the conductor array. As a result, the conductor array is relatively rigid and easy to handle, and stabbing the terminal tips 108 through the apertures of the circuit board can quickly be accomplished. The depth of insertion of the terminal tips 108 is limited by engagement of shoulders 110 with the top surfaces 196 of the board. It is preferred that the terminal tips be inserted in the board prior to soldering the leads of the other components such as resistors 188 to the board. Such soldering can be accomplished by dipping to simultaneously solder the component leads as well as all terminal tips 108 to the board. After the terminal tips are soldered, bridging strip 114 can be broken away by flexing the strip in the direction of arrows 198 to break the bridging strip at the weakened lines 118 (FIG. 5) between the bridge legs 116 and lateral extensions 112. At this stage of assembly, multiple conductors 18 project perpendicularly with respect to the circuit board 16 but still form a relatively stiff assembly by virtue of the bridging strip 140 which is still secured to their contact ends. By virtue of this second bridging strip 140, the circuit board can be handled quite easily without danger of in any way damaging the individual conductors or contacts of the conductor array.

The next step is the mounting of contact ends 24 in the recesses of socket portion 22 of the display panel holder. Such mounting is accomplished quite readily in accordance with the invention. As previously described with reference to FIG. 3, there is an unobstructed opening 89 between edge 91 of the display holder frame 50, and contact support bar assembly 86 of the display holder. Bridging strip 140 of the contact array is passed through this opening from behind the display window 30, and the display holder is then moved toward the circuit board until the contact bodies 120 are beyond the recesses, and the conductor bodies 106 are opposed to the recesses. The conductor bodies can then be moved into the recesses beneath the level of edges 158 and surfaces 178 of the respective laterally enlarged ends of a recess, as shown at FIGS. 6 and 11. This can be done because each conductor body 106 has a width slightly less than the distance between the side surfaces 180 and 182 respectively of these ends (see FIG. 8). Then, the contact holder is pulled toward the bridging strip 140, or alternately the strip is pushed toward the contact holder (see FIGS. 1 and 8) which causes body 120 of each contact end to pass under edge 158 until the latch fingers 136 (FIG. 5) enter the region between the side surfaces 154 of the recess. By virtue of the resiliency of legs 132 of the contact end body 120 (see FIG. 5), the latch fingers flex inwardly as the contact body is pulled through the recess. Ultimately, the then compressed latch fingers 136 pass beyond lock shoulders 164 and snap outwardly (see FIGS. 7 and 8). Lock tab 128 of a contact body engages surfaces 160 of a socket recess to prevent pulling the contact body out of the recess in a direction toward its terminal tip ends, and latch fingers 136 lock behind shoulders 168 to prevent pulling the contact ends out of the sockets in the opposite direction. FIGS. 8 and 12 show the display holder with the contacts seated therein.

With the contact ends so secured in the display holder, the bridging strip 140 (FIG. 13) is broken off by bending along the weakened lines 142. The display panel is then inserted into the holder while the multiple conductors are straight and perpendicular to the circuit board. Insertion of the display panel while the conductors are straight provides for insertion of the panel while there is very low contact pressure between contacts 122 and the fragile conductors 48 of the display panel.

Next, the circuit board is mounted in base casing 12 and secured in any suitable manner, for example, with screws. The display holder is then turned from the position of FIG. 12, about an axis parallel to circuit board 16 and the plane of the width of the conductors so the display holder window 30 is generally parallel with the circuit board. In this position, cover 14 is moved over the display holder, mounting arms 64 of the display holder are aligned with recess 72, and the cover is pressed down into a seated position on base casing 12. During such final closing, resilient mounting fingers 66 and 68 are clamped between the cover and base, as previously described, to provide a shock proof mounting for the display holder. The cover is then secured to the base for example, with screws and the assembly is complete.

As shown in FIGS. 1 and 4, there is a space 200 between display window 30 and the rectangular opening 34 of cover 14. This space shows that the display holder is held only by the arms 64 which are clamped at their ends between base 12 and cover 14. By virtue of the resiliency of the ends of the arms, the display holder is firmly held, but can move to absorb shock and impact which might normally damage the delicate display panel 26.

During such final assembly, where the display holder is rotated from the position of FIG. 12 to the position of FIGS. 1 and 13, multiple conductors 18 become curved and cause contacts 122 to extend and exert higher contact pressure against the deposited conductors of the display panel, thereby assuring good electrical contact in the final assembly position. As shown in FIG. 13, contact end body 120 becomes bowed upwardly as a result of engagement with edges 158 and 168, as the conductor body is curved downwardly. Such bowing of the contact end body causes the contact 122 to tilt upwardly, thereby increasing the contact pressure. The relaxed position of the conductors and contact ends is shown in dotted lines in FIG. 13, and the bowed condition is shown in solid lines.

It will be observed from FIG. 1 that a stop rib 208 projects downwardly from cover 14 to a location closely adjacent edge 210 of display panel 26. This rib prevents the display panel from sliding out of the mounted display holder.

While a preferred method of assembly has been described, it will of course be apparent that terminal tips 108 need not be soldered to the circuit board simultaneously by dipping, but can be hand soldered to the circuit board individually, preferably prior to removing the bridging strip. The conductor array 96 can thus be used for assembling electrical and electronic apparatus from kit form, by the hobbyist.

Where additional electrical connections are to be made to circuit board 16 after the circuit board is mounted in casing 12, display panel 26 can be inserted into the display holder after mounting the circuit board, but before orienting the display holder in its mounting position of FIG. 1.

While a preferred embodiment of contact array, display holder, and method of assembly have been shown and described, it is of course apparent that numerous changes and variations can be made without departing from the intended scope of this invention as set forth herein and in the appended claims.

I claim:

1. A method of electrically connecting multiple conductors to multiple spaced apart terminals comprising the steps of: forming a unitary metal and conductor assembly having multiple, flat, elongated, spaced apart conductor bodies in side by side relation to each other, with a terminal tip at a common end of each body; maintaining the terminal tips in a predetermined spaced relation to each other with a bridge bent to project at an angle to the plane of the flat conductor bodies and integrally interconnecting the conductor bodies at a location near the terminal tips and inwardly thereof; simultaneously associating said multiple terminal tips with said multiple terminals; and disconnecting said bridge from said conductor bodies after the terminal tips are associated with the multiple terminals.

2. A method according to claim 1 wherein said step of associating said terminal tips with said multiple terminals comprises securing the terminal tips to the multiple terminals.

3. A method according to claim 1 wherein said bridge is joined to each conductor along a weakened line, and said step of removing the bridge comprises bending the bridge along the weakened line to break the bridge from the conductor bodies.

4. A method according to claim 1 wherein each terminal tip has an abutment shoulder at a location between its end and the joining point of the bridge with a conductor body, the abutment shoulders of the several tips being in a common plane; said terminals comprise conductors of a circuit board having apertures therein, and said step of associating said terminal tips with said terminals further comprises simultaneously inserting said terminal tips into said circuit board apertures to abut said shoulders against the circuit board.

5. A method according to claim 1 wherein said terminals comprise circuit board conductors having apertures therein; and said step of associating said terminal tips with said terminals comprises: inserting said terminal tips through said apertures, and soldering said terminal tips to said circuit board conductors prior to removing said bridge.

6. A method according to claim 5 wherein said step of soldering the terminal tips to the conductors comprises simultaneously soldering the multiple terminal tips to the multiple terminals.

7. A method according to claim 1 wherein each of said elongated conductor bodies has a second terminal adjacent its end opposite the terminal tip end, and the method further comprises the steps of: maintaining the second terminals in spaced relation to each other with an integral bridging strip adjacent said second terminals; simultaneously connecting said multiple second terminals to an insulating material support; and removing said second bridging strip after connecting the second terminals to the support.

8. A method according to claim 7 wherein each second terminal is a snap-lock fit in a recess of the insulating material support, and each of said conductor bodies has a narrow portion of a width less than its second terminal, and said step of connecting said second terminals to said support includes first inserting said narrow portion of each conductor body through a recess of the support, and then simultaneously threading said second terminals through said recesses of the support to a snap-lock position prior to removing the second bridging strip.

9. A conductor-connector assembly comprising a unitary metal electrical conductor assembly having flat, elongated, multiple, spaced apart conductor bodies in a common plane, a terminal tip at a common end of each of said multiple bodies, integral bridge means connected to each of said bodies at a location near its tip but between said conductor body and said terminal tip, said bridge means extending at an angle to the plane of said conductor bodies, each of said conductor bodies having a width substantially greater than its thickness so that the bodies are relatively stiff laterally, in their common plane, and flexible in a direction normal to their common plane, said bridge means providing means for maintaining said terminal tips in predetermined spaced relation with respect to each other during association of the terminal tips with another terminal array, said bridge means extending at said angle to said plane of the conductor bodies at a location only slightly inwardly of the terminal tips, exposing said tips for simultaneous association with said another terminal array, and said bridge means being readily severable after association of the terminal tips with the terminals.

10. A conductor-connector assembly according to claim 9 wherein each conductor further includes, a contact end remote from said terminal tip, said contact end comprising, a resilient contact, and a bridging strip interconnecting the contact ends to maintain the conductor bodies and contact ends spaced and parallel to each other.

11. A conductor-connector assembly according to claim 9 wherein each terminal tip includes a stop shoulder between an extreme end of the tip and the location of the connection of the bridge means with a conductor body.

12. A conductor-connector assembly according to claim 9 which further includes, an insulating material contact holder having multiple spaced apart recesses, said conductor assembly further including a plurality of contact ends integral with the conductor bodies and remote from the terminal tips, said contact ends each having a width greater than the conductor bodies, said recesses opening in a common direction and including contact end retaining surfaces in spaced relation to a base portion of a recess, said retaining surfaces of each recess having a space therebetween greater than the width of a conductor body but smaller than the width of a contact end, so that the conductor bodies can be placed simultaneously in said recesses, and pulled in a common direction to thread the contact ends into the recesses and below the retaining surfaces.

13. A conductor-connector assembly according to claim 12 wherein each recess further includes, a first stop surface transverse to the length of a recess and a second stop surface transverse to the length of the recess and spaced from the first surface, said stop surfaces facing in opposite directions, said contact ends each including stops facing in opposite directions and spaced apart a distance approximating the spacing between the stop surfaces of a recess, at least one of said contact end stops being resilient to enable threading said contact ends to a position in which the conductor body stops are opposed to the recess stops, to secure the contact ends against withdrawal with respect to the recesses.

14. A conductor-connector assembly according to claim 13 wherein the conductor-connector assembly further includes, a bridging strip interconnecting the contact ends to maintain said contact ends in predetermined spaced relation to each other.

15. A conductor-connector assembly according to claim 14 wherein, each contact end has a unitary resilient contact joined thereto at a first location generally in the plane of the contact end, said contact projecting beyond one face of the contact end, a first surface of each recess engaging said one face of the contact, a second surface of each recess engaging an opposite face of a contact end at a location spaced longitudinally from the location of engagement of said first surface, said surfaces cooperating with said contact ends to resiliently urge said contacts further from said one face, to increase the contact pressure between said contacts and a conductor array in opposed relation to and spaced from said one face, in response to elastically curving said elongated conductor bodies.

16. A plug-in connector arrangement comprising, multiple resilient conductors each having an elongated conductor body and an initially relaxed contact end, each contact end having a resilient contact projecting in a common direction away from one face of the contact end and integrally joined to the contact end at a first location, a socket of electrically insulating material, means in said socket for mounting said contact ends and contacts in an initially relaxed condition in aligned side by side relation, surface means on said socket for engaging said one face of a contact end, second surface means on said socket for engaging an oppositely facing surface of said contact end between the location of engagement of the first surface means with said one face, and said first location where the contact joins the contact end, said elongated conductor bodies each being resiliently curved and tensioned after mounting said contact ends in said socket to cause each initially relaxed contact end to bow between said first and second surface means of the socket, to urge said contacts further away from said one face of a contact end, to thereby increase the contact pressure between the contacts and a plug-in element in opposed relation to said one face, and means remote from said socket to maintain the elongated conductor bodies resiliently curved and tensioned.

17. A plug-in connector arrangement according to claim 16 wherein, said socket further includes, means for guiding said plug-in element to a predetermined position with respect to said contacts.

18. A plug-in connector arrangement according to claim 16 wherein, said connector arrangement further includes cooperating means on said multiple contacts and said socket for retaining said contact ends against displacement with respect to the socket.

* * * * *